United States Patent
Tomlin et al.

(10) Patent No.: US 9,286,176 B1
(45) Date of Patent: Mar. 15, 2016

(54) SELECTIVE SKIPPING OF BLOCKS IN AN SSD

(71) Applicants: Western Digital Technologies, Inc., Irvine, CA (US); Skyera, LLC, San Jose, CA (US)

(72) Inventors: Andrew J. Tomlin, San Jose, CA (US); Justin Jones, Burlingame, CA (US); Rodney N. Mullendore, San Jose, CA (US); Radoslav Danilak, Cupertino, CA (US)

(73) Assignees: Western Digital Technologies, Inc., Irvine, CA (US); Skyera, LLC, San Jose, CA (US)

(*) Notice: Subject to any disclaimer, the term of this patent is extended or adjusted under 35 U.S.C. 154(b) by 127 days.

(21) Appl. No.: 14/156,354

(22) Filed: Jan. 15, 2014

Related U.S. Application Data

(60) Provisional application No. 61/901,958, filed on Nov. 8, 2013.

(51) Int. Cl.
G06F 11/00 (2006.01)
G06F 11/20 (2006.01)
G06F 12/02 (2006.01)

(52) U.S. Cl.
CPC ........ G06F 11/2094 (2013.01); G06F 12/0246 (2013.01)

(58) Field of Classification Search
CPC .................................................. G06F 11/0246
USPC ............... 714/6.1, 6.11, 6.12, 6.13, 6.2, 6.21, 714/6.22, 6.32
See application file for complete search history.

(56) References Cited

U.S. PATENT DOCUMENTS

| | | | |
|---|---|---|---|
| 5,696,927 A | 12/1997 | MacDonald et al. | |
| 6,240,525 B1 | 5/2001 | Chiang | |
| 6,856,556 B1 | 2/2005 | Hajeck | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 * | 9/2009 | Merry et al. | 710/56 |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |

(Continued)

OTHER PUBLICATIONS

Mei-Man L. Syu, et al., U.S. Appl. No. 13/713,561, filed Dec. 13, 2012, 21 pages.

*Primary Examiner* — Dieu-Minh Le
(74) *Attorney, Agent, or Firm* — Wilmer Cutler Pickering Hale and Dorr LLP

(57) ABSTRACT

A solid state drive (SSD), includes: a plurality of solid state memory devices, each solid state memory device including a plurality of memory blocks arranged in a plurality of planes; a storage; and an SSD controller configured to: write data to memory blocks in a predefined sequence, detect a defective memory block in the plurality of solid state memory devices, mark the detected memory block as defective and store an address of a next non-defective memory block, and in response to data to be written to the marked memory block, the controller skips the marked memory block and writes the data to the next non-marked memory block.

20 Claims, 6 Drawing Sheets

(56) References Cited

U.S. PATENT DOCUMENTS

| | | |
|---|---|---|
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 * | 1/2012 | Diggs et al. ................. 714/763 |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,285,919 B2 | 10/2012 | Luo et al. |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2005/0022084 A1 | 1/2005 | Hii et al. |
| 2009/0083591 A1 | 3/2009 | Brune et al. |
| 2009/0157950 A1 | 6/2009 | Selinger |
| 2010/0095148 A1 | 4/2010 | Cheng |
| 2010/0122148 A1 * | 5/2010 | Flynn et al. ................. 714/773 |
| 2010/0174849 A1 | 7/2010 | Walston et al. |
| 2010/0250793 A1 | 9/2010 | Syu |
| 2011/0066793 A1 * | 3/2011 | Burd ............................ 711/103 |
| 2011/0099323 A1 | 4/2011 | Syu |
| 2011/0131472 A1 * | 6/2011 | Antonakopoulos et al. .. 714/773 |
| 2011/0283049 A1 | 11/2011 | Kang et al. |
| 2012/0005561 A1 | 1/2012 | Trager et al. |
| 2012/0159262 A1 | 6/2012 | Santana da Costa et al. |
| 2012/0239972 A1 * | 9/2012 | Shibata et al. ................. 714/15 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

\* cited by examiner

SELECTIVE SKIPPING OF BLOCKS IN AN SSD

CROSS-REFERENCE TO RELATED APPLICATION(S)

This application claims the benefit of U.S. provisional application No. 61/901,958, filed Nov. 8, 2013, the disclosure of which is hereby incorporated in its entirety by reference.

BACKGROUND

1. Technical Field

Apparatuses and methods consistent with the present inventive concept relate generally to data storage devices, and in particular to selectively skipping memory blocks during write operations in solid state data storage devices.

2. Related Art

A data storage system may include various volatile and non-volatile storage devices such as a hard disk drive (HDD), an optical storage drive, and a solid state drive (SSD). An SSD provides increased throughput capability due to its parallel architecture incorporating a plurality of solid state memory devices and data striping across the plurality of memory devices. A representative solid state memory device is illustrated in FIG. 1.

The solid state memory device 100 includes a plurality of blocks 110 with each block including a plurality of pages 120. The blocks in the memory device 100 may be divided into planes of even-numbered blocks 130 and odd-numbered blocks 140. In an example embodiment, there are 2,048 blocks per memory device configured with 16 channels, with one channel providing access to an active memory device in that channel.

Conventionally, a solid state memory device contains additional otherwise unused replacement memory areas which are logically mapped to memory locations that are unable to be used. However, this method is inefficient as it results in wasted unused memory in the replacement memory areas. Further, memory locations in the replacement memory may have different characteristics than the memory locations they are logically mapped to as a result of different wear (i.e., different number of read/write/erase cycles) leading to inconsistent results during data read and write operations.

BRIEF DESCRIPTION OF THE DRAWINGS

Aspects and features of the present inventive concept will be more apparent by describing example embodiments with reference to the accompanying drawings, in which.

DETAILED DESCRIPTION

While certain embodiments are described, these embodiments are presented by way of example only, and are not intended to limit the scope of protection. The methods and systems described herein may be embodied in a variety of other forms. Furthermore, various omissions, substitutions, and changes in the form of the example methods and systems described herein may be made without departing from the scope of protection.

Overview

The present inventive concept provides for a mechanism for selectively skipping memory blocks in an SSD so they are not written to or read from. The skipped memory blocks may be referred to as "holes."

Figure 2:
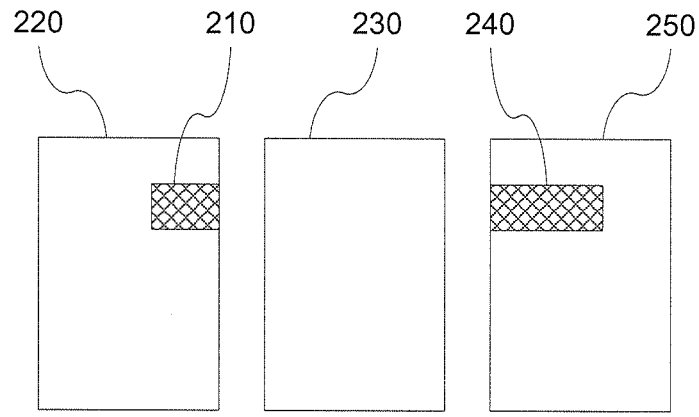
FIG. 2 is a diagram illustrating a memory block hole according to an example embodiment of the present inventive concept.

FIG. 2 is a diagram illustrating a memory block hole according to an example embodiment of the present inventive concept. As illustrated in FIG. 2, data 210 that cannot be written completely within a memory block 220 continues to be written to the next sequential memory block 230. However, if the next sequential block 230 is defective, i.e., is a hole, data cannot be written to that block. In that case, the remaining data 240 is written to the next sequential non-defective block 250. Thus, holes can be skipped to prevent mapping data to defective memory blocks.

Figure 1:
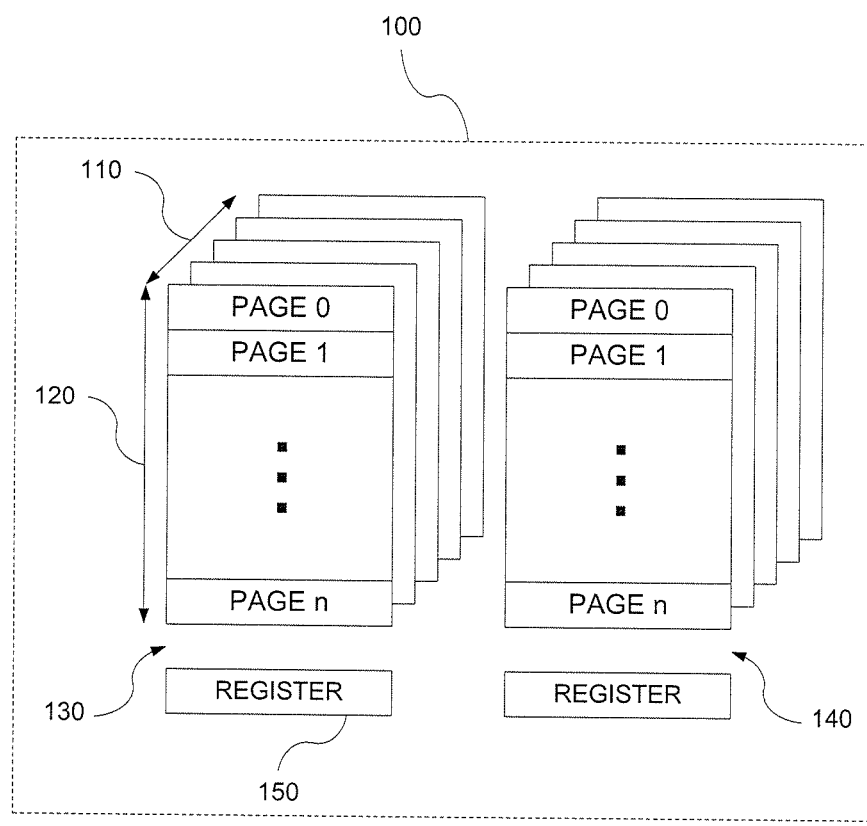
FIG. 1 is an illustration of a conventional solid state memory device.
Figure 3:
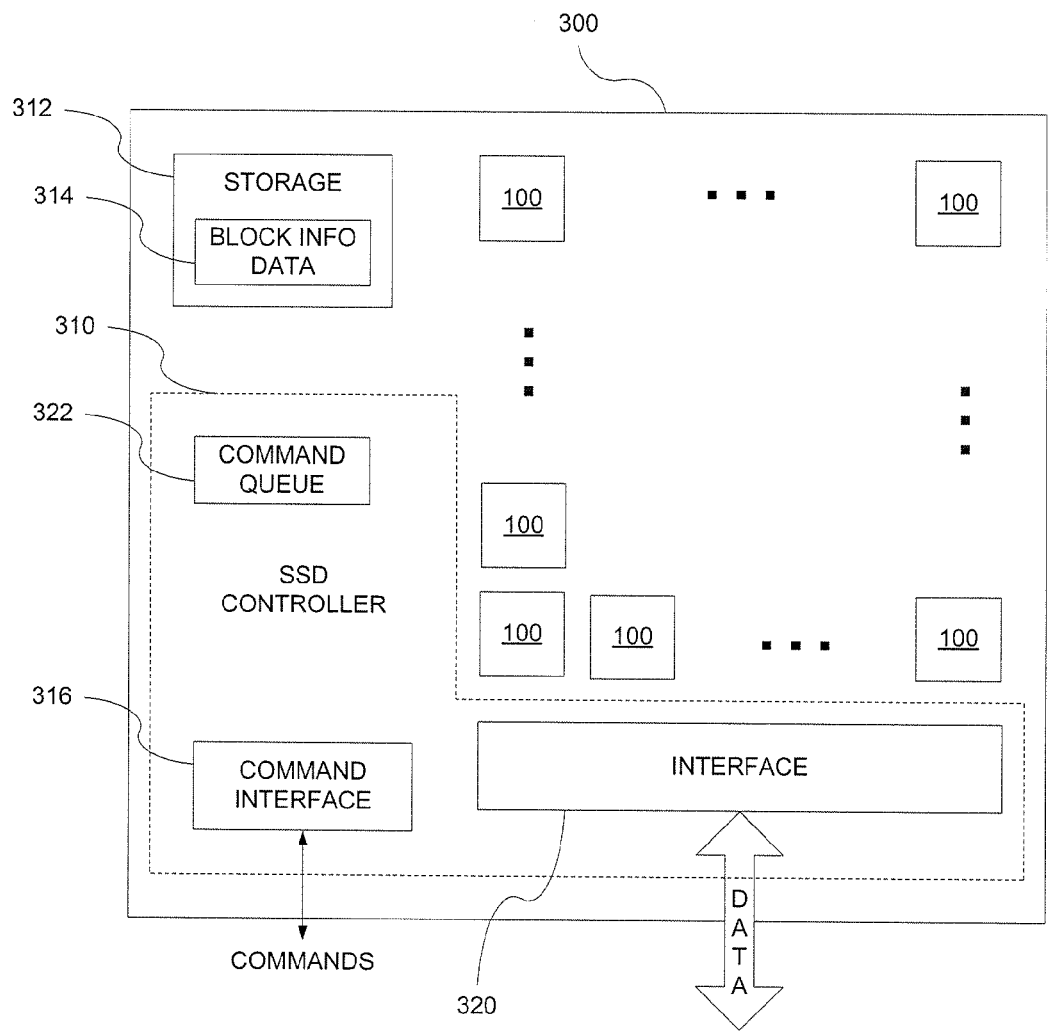
FIG. 3 is a block diagram illustrating an SSD according to an example embodiment of the present inventive concept.

FIG. 3 is a block diagram illustrating an SSD according to an example embodiment of the present inventive concept. As illustrated in FIG. 3, an SSD 300 may include a plurality of memory devices 100, for example, but not limited to, 256 memory devices, and an SSD controller 210.

The SSD controller 310 may include a command queue 322, a command interface 316, and a data interface 320. In some example embodiments, the data interface 320 may be separate from the SSD controller 310.

The SSD controller 310 receives commands through the command interface 316 and controls overall operation of the SSD 300. The SSD controller 310, may be configured to perform memory management processes, for example, but not limited to, write memory blocks in a predefined sequence, detect a defective memory block in the plurality of solid state memory devices, mark the detected memory block as defective and store an address of a next non-defective memory block. The data interface 320 buffers incoming and outgoing data to be written to or read from the SSD 300.

In response to data to be written to a marked memory block, the controller may perform operations to skip the marked memory block and write data to, or read data from, the next non-marked memory block.

A storage 312 stores information including, but not limited to, block information identifying defective memory blocks in the plurality of memory devices 100 as well as information identifying a next non-defective memory block. The block information may be embedded in a block information data structure 314 in the storage 312.

The block information data structure 314 may act as, in effect, a "pointer" to the next non-hole block. In this way, any intervening hole(s)/blocks in writing or reading a page that may "span" across two blocks separated by such hole(s)/block(s) may be automatically skipped over.

Selective Skipping of Memory Blocks

Some embodiments of the present inventive concept provide for a mechanism for selectively skipping memory blocks in an SSD so they are not written to and read from. The skipped memory blocks may be referred to as "holes." FIG. 2 is a diagram illustrating a memory block hole. Referring to FIG. 2, holes can be used to skip defective memory blocks so that data is not mapped to the defective memory blocks. By finding the "holes," the SSD hardware can automatically skip over any intervening hole(s)/block(s) that may "span" across two blocks separated by such hole(s)/block(s) when writing or reading a page.

Figure 4A:
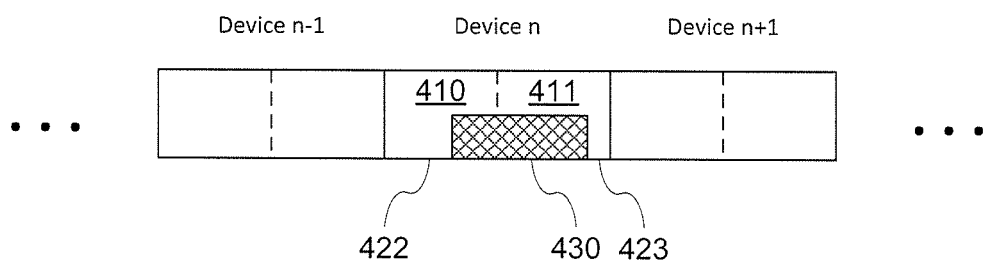
FIG. 4A is a diagram illustrating data written across two planes of a dual-plane solid state memory device according to an example embodiment of the present inventive concept.

FIG. 4A is a diagram illustrating data written across two planes of a dual-plane solid state memory device according to an example embodiment of the present inventive concept. FIG. 4A shows one memory block 410, 411 in each plane 422, 423 of a dual plane memory device, Device n. A plurality of memory blocks grouped together may be referred to as a Superblock or S-Block. The individual blocks that form an S-Block may be chosen from one or more dies, planes or other levels of granularity. In an SSD using dual plane memory devices, data may be written to pages on the odd and even blocks of device n as specified in an S-block.

As illustrated in FIG. 4A, data 430 written to a memory device need not start on a block boundary and may span the boundary between two memory blocks. However, if the next memory block to which data should be written is defective, data cannot be written to the defective memory block.

Figure 4B:
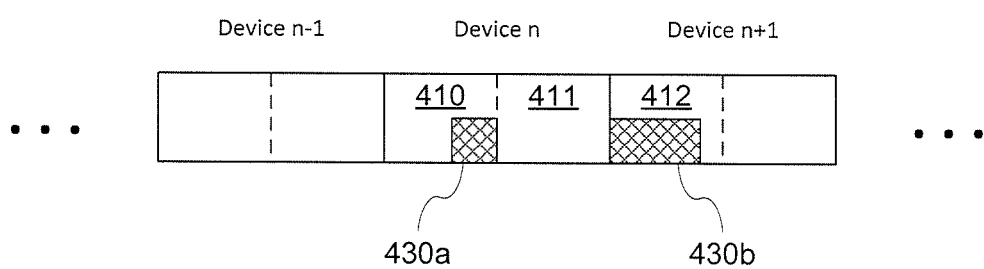
FIG. 4B is a diagram illustrating data written in a dual-plane solid state memory device having a defective memory block in one of the planes according to an example embodiment of the present inventive concept.

FIG. 4B is a diagram illustrating data written in a dual-plane solid state memory device having a defective memory block in one of the planes according to an example embodiment of the present inventive concept. As shown in FIG. 4B, data 430a written to a first block 410 spanning the block boundary cannot be written to the next sequential block 411, for example because the block is defective. The block 411 is marked as a "hole" and the remaining data 430b is written to the next "non-hole" block 412, in this in this example, a block in device n+1, as illustrated in FIG. 4B.

One of ordinary skill in the art will appreciate that memory blocks marked as holes may similarly be skipped during read operations.

In a multi-plane (i.e., two or more planes) memory device, when the memory blocks in less than all of the planes in a solid state memory devices are defective, the controller may mark the detected memory blocks as defective and skip only the marked memory blocks during a write or read operation to the solid state memory device.

In an example embodiment, if a weak block is detected, its wear can be selectively modulated (i.e., slowed) by periodically marking it as a "hole." For example, a weaker block can be marked as a "hole" every 2nd write cycle so that it incurs half of program/erase (P/E) cycles as other memory blocks. In one embodiment, the present inventive concept can also be implemented to mark a block as a "hole" every 3rd cycle, 4th cycle, etc. so that different blocks can undergo different wear schedules. Alternatively, in an example embodiment, a block may be marked as a "hole" every n out of m cycles, where n and m are integer values with m>n. The marking may be cleared after a certain number of write cycles are executed. As will be described further below, certain metadata associated with the blocks may be tracked and retained and can be used to determine whether a block is weak. For example, a block may be deemed to be weak if it requires an error correction level of protection that is above a predetermined threshold.

In an example embodiment, at the S-Block level, every other (e.g., $3^{rd}$, $4^{th}$, etc.) memory block can be marked as a "hole" so that only some the blocks are written each cycle. Those blocks marked as "holes" can alternate/rotate between cycles.

Figure 5A:
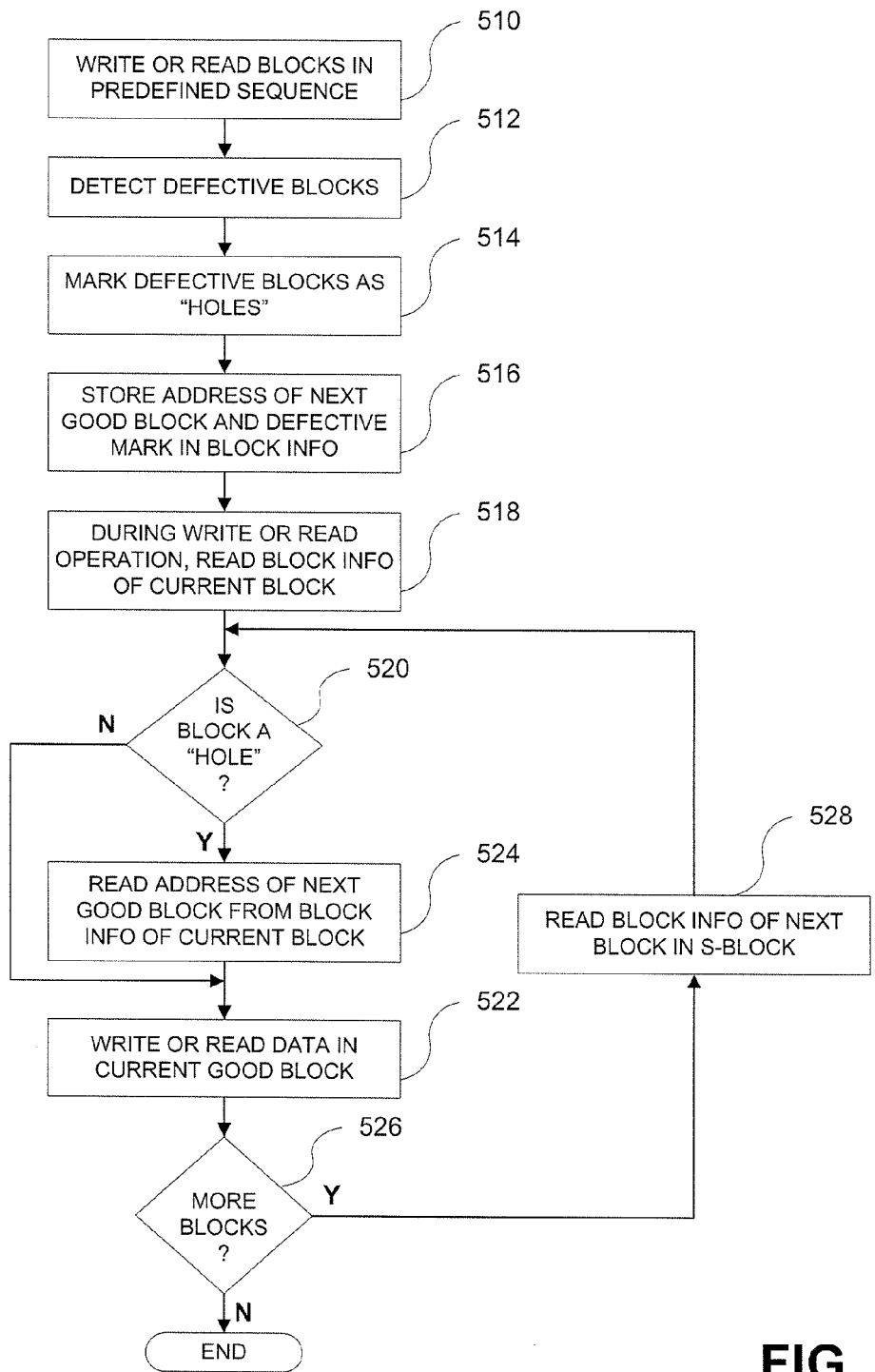
FIG. 5A is a flowchart illustrating a method for selective skipping of blocks according to an example embodiment of the present inventive concept.

FIG. 5A is a flowchart illustrating an example embodiment of a method according to the present inventive concept. In the example embodiment, data is written to memory blocks in a predefined sequence (510). Defective memory blocks are identified (512) and marked as such by other memory management processes (514). The next-non-hole block information is stored, for example, embedded in the block information data structure (refer to 314 in FIG. 3) which contains information including whether a memory block is a "hole" and the address of the block information data structure of the next known non-defective block in the S-block (516). In effect, it is a "pointer" to the next non-hole block. The defective block discovery process may be ongoing during SSD operation.

The block information data structure 314 tracks metadata related to each block in the data storage system. There may be 256 blocks in an S-Block. Metadata may include information including, but not limited to, P/E count, read disturb count, low-density parity-check (LDPC) information, E-page format, etc. The E-Page format field may be used to signify the E-Page size in use within the block. The E-Page size is used to reflect the strength of the error correction code (ECC) encoding used (larger ECC equates to smaller E-page size due to more bits devoted for parity data usage).

Within the E-page format field, a special code may be used to signify that a memory block is to be skipped (i.e., treated as a "hole") in the system so that data is not written to the block. For example, the Block Information data structure may have a code which indexes into another table which provides an E-Page size to the code. One special size may be reserved for a page "hole." Each page may have a code indicating that it is a "hole." The code may be used to skip upper pages, first/last pages if they are weak, etc.

During a write or read operation, the block information data structure 314 is read for the block to which data is to be written to or read from (518). If the block information indicates that the block is not a "hole" (520-N), the data is written to or read from the block (522).

If the block information indicates that the block is a "hole" (520-Y), the address of the next non-defective (i.e., "good") block is read from the block information data structure 314 (524) and the data is written to or read from the non-defective block (522). If there are more blocks to read/write (526-Y), the block information of the next block in the S-block is read (528) and the process continues at operation 520. Otherwise (526-N), the process ends.

Figure 5B:
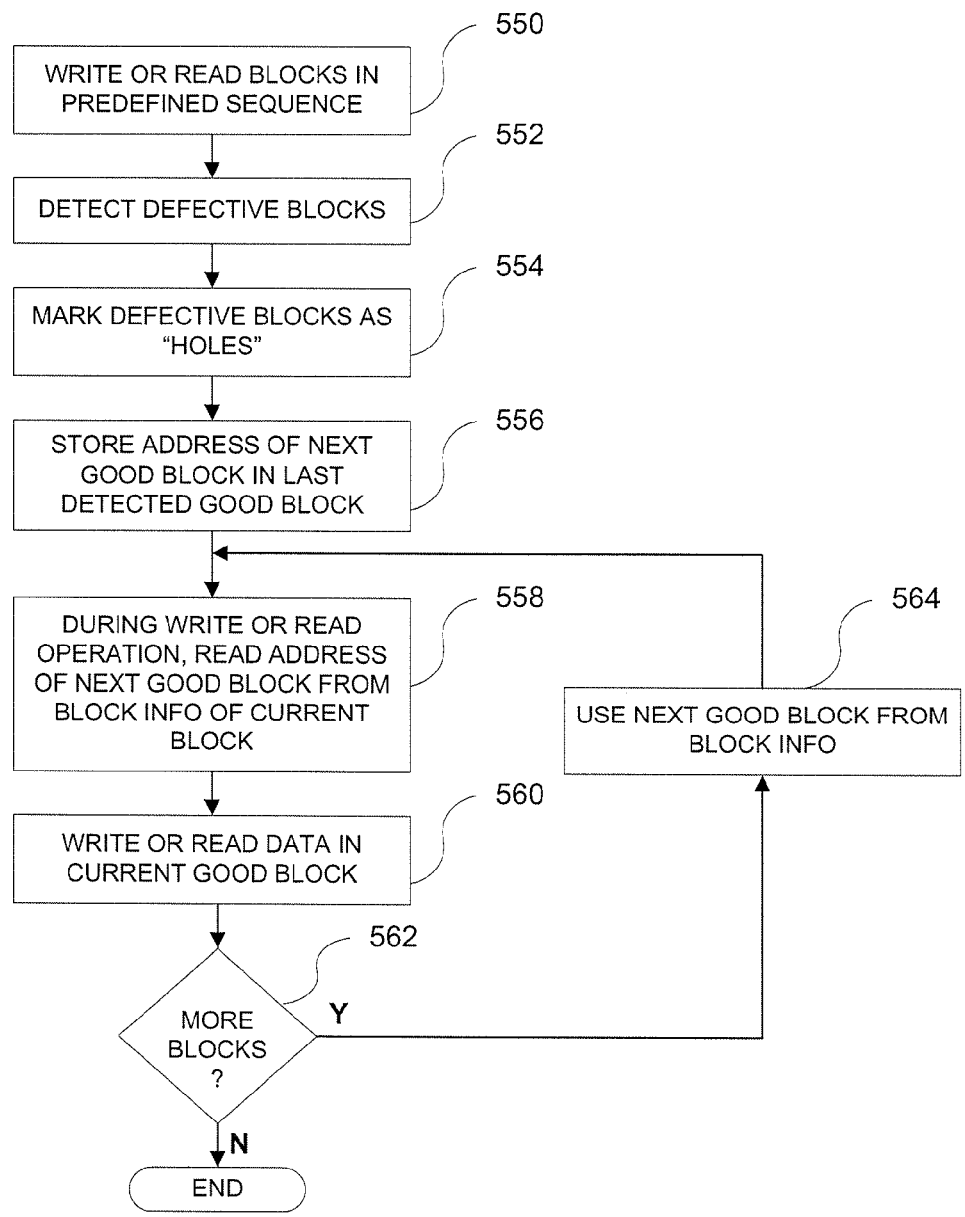
FIG. 5B is a flowchart illustrating another method for selective skipping of blocks according to an example embodiment of the present inventive concept.

FIG. 5B is a flowchart illustrating another method for selective skipping of blocks according to an example embodiment of the present inventive concept. Referring to FIG. 5B, data is written to memory blocks in a predefined sequence (550). Defective memory blocks are identified (552) and marked as such by other memory management processes (554). The address of the next good (i.e., non-defective) block is stored in the information data structure of the last detected good block (556).

During a write or read operation for the current block, the block information data structure is read to obtain the address of the next good block (558) and data is written to or read from the current block (560). If there are more blocks to read/write (562-Y), the address of the next good block that was read from the block information data structure is used to point to the next good block (564) and the process continues at operation 558. Otherwise (562-N), the process ends.

Figure 6:
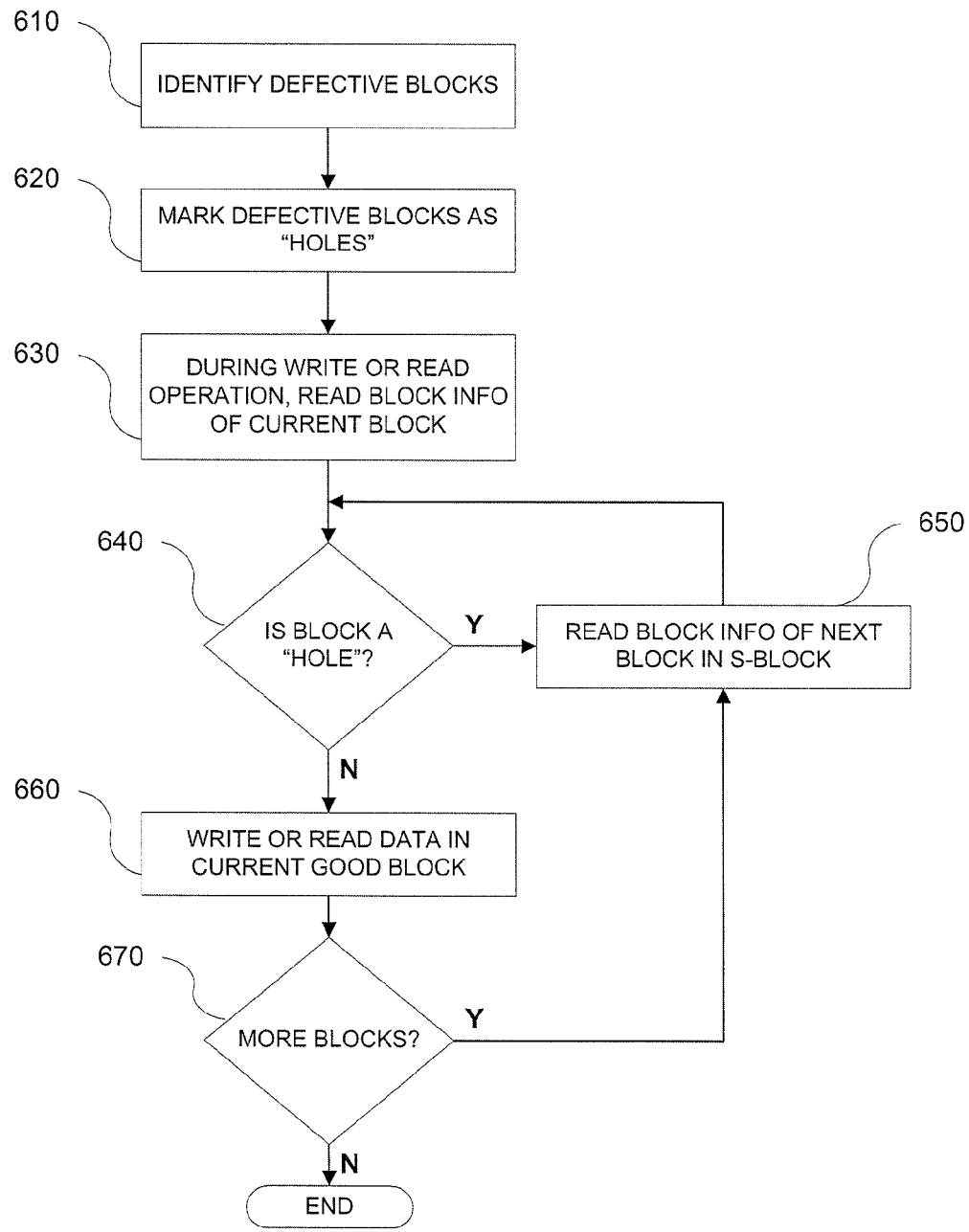
FIG. 6 is a flowchart illustrating another method according to an example embodiment of the present inventive concept.

FIG. 6 is a flowchart illustrating example embodiment of another method according to the present inventive concept. The method illustrated in FIG. 6 is similar to the method illustrated in FIG. 5A, except the next-non-hole block information is not embedded in a block information data structure.

In the method of FIG. 6, defective memory blocks are identified (610) and marked as such by other memory management processes (620). During a read or write operation, block information of the current block is read (630). If the block information identifies the current block as a hole (640-Y), block information for the next block in the S-block is read (650). The next non-hole block may be located by iteratively reading the block information of each block until a non-hole is found.

If the block information identifies the current block as a good (i.e., non-defective) block (640-N), data is written to or read from the block (660). If there are more blocks to read/write (670-Y), block information for the next block in the S-block is read (650) and the process continues at operation 640. Otherwise (670-N), the process ends.

The example embodiments disclosed herein can be applied to solid state drives, hybrid hard drives, and the like. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. In addition, other forms of storage, for example, but not limited to, DRAM or SRAM, battery backed-up volatile DRAM or SRAM devices, EPROM, EEPROM memory, etc., may additionally or alternatively be used. As another example, the various components illustrated in the figures may be implemented as software and/or firmware on a processor, ASIC/FPGA, or dedicated hardware. Also, the features and attributes of the specific example embodiments disclosed above may be combined in different ways to form additional embodiments, all of which fall within the scope of the present disclosure.

While certain embodiments have been described, these embodiments have been presented by way of example only, and are not intended to limit the scope of the protection. The methods and systems described herein may be embodied in a variety of other forms. Various omissions, substitutions, and/or changes in the form of the example methods and systems described herein may be made without departing from the spirit of the protection.

Other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A solid state drive (SSD), comprising:
a plurality of solid state memory devices, wherein one of the plurality of solid state memory devices comprises a plurality of memory blocks arranged in a plurality of planes;
a storage; and
an SSD controller configured to:
write data to the plurality of memory blocks in a predefined sequence,
detect a defective memory block in one of the plurality of memory blocks,
mark the detected memory block as defective and store an address of a next non-defective memory block,
in response to data to be written to the marked memory block, skip the marked memory block and write the data to the next non-marked memory block, and
in response to detecting a weak memory block, periodically mark the weak memory block as defective for a predetermined number of write cycles and then clear the mark.

2. The SSD of claim 1, wherein the storage comprises a block information data structure configured to contain information indicating whether a memory block is defective and the address of the next non-defective memory block.

3. The SSD of claim 1, wherein in response to detecting that corresponding memory blocks in each of the plurality of planes in one of the plurality of solid state memory devices are defective, the controller is configured to mark the solid state memory device as defective and skip the device during a write operation to the corresponding memory blocks.

4. The SSD of claim 1, wherein in response to detecting that corresponding memory blocks in less than all of the plurality of planes in one of the plurality of solid state memory devices are defective, the controller is configured to mark the detected memory blocks as defective and skip only the marked memory blocks during a write operation to the solid state memory device.

5. The SSD of claim 1, wherein the SSD controller is further configured to determine that the weak memory block is weak based on metadata associated with the weak memory block.

6. The SSD of claim 5, wherein the SSD controller is configured to determine that the weak memory block is weak when a required error correction level is above a predetermined threshold.

7. A method for writing data to a solid state drive (SSD) comprising a plurality of memory devices, the method comprising:
writing data to a plurality of memory blocks in one of the plurality of memory devices in a predefined sequence;
detecting a defective memory block in the plurality of memory blocks;
marking the detected memory block as defective;
storing an address of a next non-defective memory block;
in response to writing data to the marked memory block, skipping the marked memory block and writing the data to the next non-marked memory block; and
in response to detecting a weak memory block, periodically marking the weak memory block as defective for a predetermined number of write cycles and then clearing the mark.

8. The method of claim 7, further comprising storing, in a block information data structure, information indicating whether a memory block is defective and the address of the next non-defective memory block.

9. The method of claim 7, further comprising:
in response to detecting that corresponding memory blocks in each of a plurality of planes in one of the plurality of solid state memory devices are defective, marking the solid state memory device as defective and skipping the device during a write operation to the corresponding memory blocks.

10. The method of claim 7, further comprising:
in response to detecting that corresponding memory blocks in less than all of a plurality of planes in one of the plurality of solid state memory devices are defective, marking the detected memory blocks as defective and skipping only the marked memory blocks during a write operation to the solid state memory device.

11. The method of claim 7, further comprising determining that the weak memory block is weak based on metadata associated with the weak memory block.

12. The method of claim 11, wherein determining that a memory block is weak comprises determining that the weak memory block is weak when a required error correction level is above a predetermined threshold.

13. A solid state drive (SSD), comprising:
a plurality of solid state memory devices, wherein one of the solid state memory devices comprises a plurality of memory blocks arranged in a plurality of planes;
a storage; and
an SSD controller configured to:
read data from the plurality of memory blocks in a predefined sequence,
detect a defective memory block in the plurality of memory blocks,
mark the detected memory block as defective and store an address of a next non-defective memory block,
in response to detecting a weak memory block, periodically mark the weak memory block as defective for a predetermined number of write cycles and then clear the mark, and
in response to data to be read from the marked memory block, skip the marked memory block and read the data from the next non-marked memory block.

14. The SSD of claim 13, wherein the storage comprises a block information data structure configured to contain information indicating whether a memory block is defective and the address of the next non-defective memory block.

15. The SSD of claim 13, wherein in response to detecting that corresponding memory blocks in each of the plurality of planes in one of the plurality of solid state memory devices are defective, the controller is configured to mark the solid state memory device as defective and skip the device during a read operation to the corresponding memory blocks.

16. The SSD of claim 13, wherein in response to detecting that corresponding memory blocks in less than all of the plurality of planes in one of the plurality of solid state memory devices are defective, the controller is configured to mark the detected memory blocks as defective and skip only the marked memory blocks during a read operation to the solid state memory device.

17. A method for reading data from a solid state drive (SSD) comprising a plurality of memory devices, the method comprising:
reading data from a plurality of memory blocks in one of the plurality of memory devices in a predefined sequence;
detecting a defective memory block in one of the plurality of memory blocks;
marking the detected memory block as defective;
storing an address of a next non-defective memory block;
in response to detecting a weak memory block, periodically marking the weak memory block as defective for a predetermined number of write cycles and then clearing the mark; and
in response to reading data from the marked memory block, skipping the marked memory block and reading the data from the next non-marked memory block.

18. The method of claim 17, further comprising storing, in a block information data structure, information indicating whether a memory block is defective and the address of the next non-defective memory block.

19. A method for writing data to a solid state drive (SSD) comprising a plurality of memory devices, the method comprising:
writing data to or reading data from a plurality of memory blocks in one of the plurality of memory devices in a predefined sequence;
detecting a defective memory block in one of a plurality of solid state memory devices;
marking the detected memory block as defective;
storing an address of a next non-defective memory block;
in response to detecting a weak memory block, periodically marking the weak memory block as defective for a predetermined number of write cycles and then clearing the mark;
during one of a write and read operation for a current memory block, reading the address of a next non-defective memory block and reading or writing data to the current memory block; and
using the address of a next non-defective memory block read from the current memory block as an address of the next non-defective memory block for reading or writing data.

20. The method of claim 19, further comprising storing, in a block information data structure of the current block, the address of the next non-defective memory block.

\* \* \* \* \*